United States Patent
Wagner et al.

(10) Patent No.: US 10,168,249 B2
(45) Date of Patent: Jan. 1, 2019

(54) MAGNETIC TRANSMISSION PARK POSITION SENSOR

(71) Applicant: GM GLOBAL TECHNOLOGY OPERATIONS LLC, Detroit, MI (US)

(72) Inventors: Sean R. Wagner, Shelby Township, MI (US); Thomas A. Perry, Bruce Township, MI (US); Scott W. Piper, Canton, MI (US); Cheol W. Kim, Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 102 days.

(21) Appl. No.: 15/488,763

(22) Filed: Apr. 17, 2017

(65) Prior Publication Data

US 2017/0336287 A1 Nov. 23, 2017

Related U.S. Application Data

(60) Provisional application No. 62/337,382, filed on May 17, 2016.

(51) Int. Cl.
| | |
|---|---|
| *G01M 13/02* | (2006.01) |
| *G01R 33/00* | (2006.01) |
| *F16H 61/36* | (2006.01) |
| *G01D 5/14* | (2006.01) |
| *F16H 61/32* | (2006.01) |
| *F16H 63/42* | (2006.01) |

(52) U.S. Cl.
CPC .......... *G01M 13/021* (2013.01); *F16H 61/36* (2013.01); *G01D 5/145* (2013.01); *G01R 33/0011* (2013.01); *F16H 2061/326* (2013.01); *F16H 2063/423* (2013.01)

(58) Field of Classification Search
USPC ......................................... 73/115.02, 115.03
See application file for complete search history.

(56) References Cited

U.S. PATENT DOCUMENTS

| 4,998,450 | A | * | 3/1991 | Nogle | ................... F16H 59/105 200/61.88 |
|---|---|---|---|---|---|
| 6,550,351 | B1 | * | 4/2003 | O'Reilly | ............... F16H 59/105 74/335 |
| 2004/0059479 | A1 | * | 3/2004 | Fleming | .................. B60T 7/045 701/31.7 |

(Continued)

*Primary Examiner* — Eric S McCall
(74) *Attorney, Agent, or Firm* — Quinn IP Law (57) ABSTRACT

A transmission range selection sensor includes a housing defining a bore extending along a central axis. A piston is slideably disposed within the bore. A magnet carrier is attached to and moveable with the piston. A magnet is supported by and moveable with the magnet carrier. A first magnetic sensor and a second magnetic sensor are supported by the housing and are spaced from each other along the central axis. A position of the magnet carrier along the central axis is determinable from a sensed magnetic flux from the first and second magnetic sensors. The sensor includes at least one magnetic flux concentrator attached to one of the magnet carrier or the housing. The flux concentrator is operable to concentrate the magnetic flux toward at least one of the first magnetic sensor or the second magnetic sensor depending upon a position of the magnet along the central axis.

19 Claims, 8 Drawing Sheets

(56) References Cited

U.S. PATENT DOCUMENTS

2016/0167635 A1* 6/2016 Neelakantan ......... B60T 13/686
   303/20
2016/0195187 A1* 7/2016 MacFarlane ............ F16H 61/12
   701/51
2018/0050668 A1* 2/2018 Spaulding ................ B60K 6/22

* cited by examiner

MAGNETIC TRANSMISSION PARK POSITION SENSOR

CROSS-REFERENCE TO RELATED APPLICATIONS

This application claims the benefit of U.S. Provisional Patent Application Ser. No. 62/337,382, filed on May 17, 2016, the disclosure of which is hereby incorporated by reference.

INTRODUCTION

The disclosure generally relates to a transmission range selection sensor.

Many vehicles prevent operation of certain functions when a transmission of the vehicle is positioned in an out-of-park position. For example, an engine ignition system may be disabled if the transmission is positioned in the out-of-park position. In order to determine if the transmission is positioned in the out-of-park position or in an in-park position, the vehicle may be equipped with a transmission position sensor, which senses the position of one or more components of a transmission control system. The position of the transmission may be communicated to one or more vehicle controllers to either enable or disable various vehicle functions as appropriate.

SUMMARY

A transmission range selection sensor is provided. The transmission range selection sensor includes a housing. The housing defines a bore that extends along a central axis. A magnet carrier is slideably disposed within the bore. A magnet is attached to and moveable with the magnet carrier. The magnet generates a magnetic field. A first magnetic sensor is attached to the housing. The first magnetic sensor is positioned at a first axial position along the central axis. A second magnetic sensor is attached to the housing. The second magnetic sensor is positioned at a second axial position along the central axis. The second axial position is spaced from the first axial position along the central axis. A position of the magnet carrier along the central axis is determinable from a sensed magnetic flux from the first magnet sensor, and a sensed magnetic flux from the second magnetic sensor.

In one aspect of the disclosure, a piston is attached to and moveable with the magnet carrier within the bore. An actuation lever is engaged with the piston. The piston includes an aperture extending through the piston in a direction transverse to the central axis, with the actuation lever positioned within the aperture. Axial movement of the piston along the central axis moves the actuation lever for controlling a transmission gear range. A servo may be connected to the piston, with the servo being operable to move the piston along the central axis.

In another aspect of the disclosure, an air gap is disposed between an interior surface of the bore and an exterior surface of the magnet carrier.

In one embodiment of the transmission range selection sensor, at least one magnetic flux concentrator is attached to one of the magnet carrier or the housing. The magnetic flux concentrator is a ferrous material. The magnetic flux concentrator may include a first magnetic flux concentrator attached to the magnet carrier, and disposed adjacent to the magnet at a first axial side of the magnet along the central axis. The magnetic flux concentrator may further include a second magnetic flux concentrator attached to the magnet carrier, and disposed adjacent to the magnet at a second axial side of the magnet along the central axis.

In another embodiment, the magnetic flux concentrator may include a third magnetic flux concentrator attached to the housing, and positioned between the first magnetic sensor and the second magnetic sensor along the central axis. The third magnetic flux concentrator is positioned nearer to the first magnetic sensor than the second magnetic sensor along the central axis.

In one aspect of the disclosure, the housing is a non-magnetic material. The first magnetic sensor and the second magnetic sensor are embedded within the housing. The third magnetic flux concentrator may also be embedded within the housing.

The above features and advantages and other features and advantages of the present teachings are readily apparent from the following detailed description of the best modes for carrying out the teachings when taken in connection with the accompanying drawings.

DETAILED DESCRIPTION

Those having ordinary skill in the art will recognize that terms such as "above," "below," "upward," "downward," "top," "bottom," etc., are used descriptively for the figures, and do not represent limitations on the scope of the disclosure, as defined by the appended claims. Furthermore, the teachings may be described herein in terms of functional and/or logical block components and/or various processing steps. It should be realized that such block components may be comprised of any number of hardware, software, and/or firmware components configured to perform the specified functions.

The following detailed description is meant to be illustrative in understanding the subject matter of the embodiments and is not intended to limit the embodiments of the subject matter or the application and the uses of such embodiments. Any use of the word "exemplary" is intended to be interpreted as "serving as an example, instance, or illustration." Implementations set forth herein are exemplary and are not meant to be construed as preferred or advantageous over other implementations. The descriptions herein are not meant to be bound by any expressed or implied theory presented in the preceding background, detailed description or descriptions, brief summary or the following detailed description.

The system and methodology described herein can be utilized to enhance a determination when a transmission is in a park position or in an out-of-park position. While the approach and methodology are described below with respect to vehicle applications, one of ordinary skill in the art appreciates that an automotive application is merely exemplary, and that the concepts disclosed herein may also be applied to any other suitable systems that utilize transmissions.

The term "vehicle" as described herein can be construed broadly to include not only a passenger automobile, but any other vehicle including, but not limited to, rail systems, planes, off-road sport vehicles, robotic vehicles, motorcycles, trucks, sports utility vehicles (SUVs), recreational vehicles (RVs), marine vessels, aircraft, farming vehicles, and construction vehicles.

Figure 1:
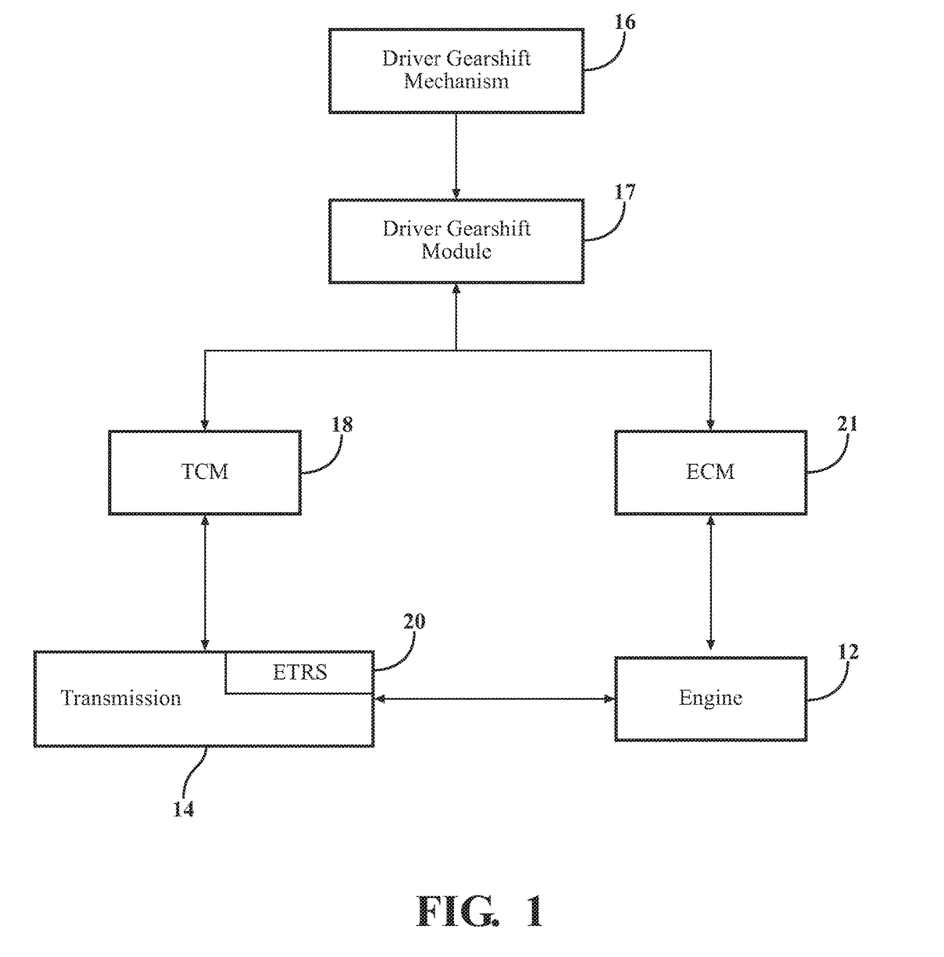
FIG. 1 is a schematic block diagram of a system for sensing a transmission position.

FIG. 1 illustrates a block diagram of a system for sensing a position of a transmission 14. The vehicle includes an engine 12 and the transmission 14. The engine 12 produces driving torque that is transferred to the transmission 14. A driver gearshift mechanism 16 enables a driver to select various transmission ranges. While the typical transmission ranges of the vehicle include Park, Reverse, Neutral, and Drive, for the purposes described herein, the transmission positions are focused on the in-park range (representing Park) and an out-of-park range (representing all other transmission ranges). The driver gearshift mechanism 16 may be coupled directly to the transmission 14 for manually transitioning the transmission 14 between the in-park and the out-of-park position, or the driver gearshift mechanism 16 may utilize electronics such as a driver gearshift module 17, a transmission control module (TCM) 18 and engine control module (ECM) 21. The requests to the driver gearshift mechanism 16 are obtained by the driver gearshift module 17 and the requests and signals are communicated between the driver gearshift module 17, TCM 18, and ECM 21 via a CAN bus. The TCM 18 receives the request by the driver gearshift module 17 and commands the gearshift range by actuating solenoids and reading the actual gearshift range using the electronic transmission range selection (ETRS) sensor 20. The TCM 18 may transmit a signal to the ECM 21 and the driver gearshift module 17 to disable or enable engine startup based on the transmission 14 being in the out-of-park position or the in-park position.

The ETRS sensor 20 determines the position of a park servo piston 22, and provides such information to the TCM 18. The ETRS sensor 20 detects the two possible positions of this servo piston 22 which indicate that the transmission 14 is either in the in-park position or in the out-of-park position. Certain vehicle functions should only be performed when the transmission 14 is in the in-park position. Therefore, the ETRS sensor 20 is used to detect the position of the servo piston 22, which indicates the operating range of the transmission 14, so that some vehicular functions may be prevented by the vehicle's control electronics if the transmission is in the out-of-park position.

Figure 2:
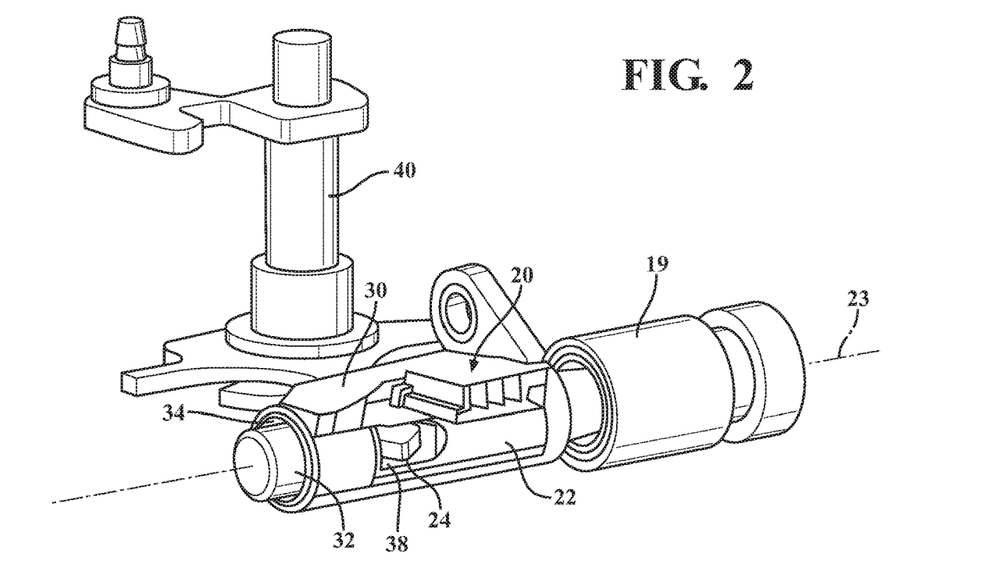
FIG. 2 is a schematic perspective view of an electronic transmission range selection (ETRS) sensor.

FIG. 2 illustrates the ETRS sensor 20. The ETRS sensor 20 includes a housing 30, which supports the park servo piston 22 and a park actuator lever 24. As shown in FIG. 2, a servo motor 19 is connected to and operable to move the piston 22 along a central axis 23. The actuator piston 22 positions the park actuator lever 24 along the central axis 23. The park actuator lever 24 is coupled to the transmission 14 which moves the transmission 14 between the in-park position and the out-of-park position.

The ETRS sensor 20 is a contactless sensor that utilizes Hall Effect sensing technology to detect a position of the park servo piston 22. It should be understood that while the ETRS sensor 20 described herein utilizes Hall Effect sensors, other types of sensors may be used to perform the same sensing operation. Hall sensors within the ETRS sensor 20, are spaced from one another, and based on the magnetic flux detected by each respective sensor, will determine the position of the park actuator lever 24, which in turn, identifies the range of the transmission (i.e., in-park or out-of-park).

Figure 3:
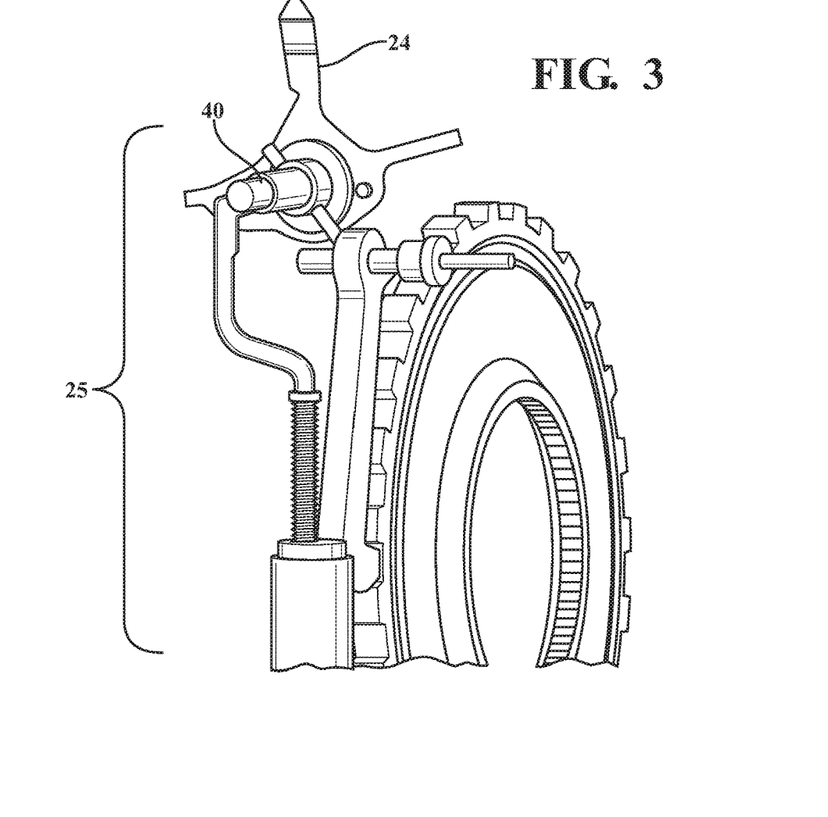
FIG. 3 is a schematic perspective view of a mechanical transmission park pawl lockout device.

FIG. 3 illustrates a mechanical transmission parking mechanism 25 coupled to the park actuator lever 24. As shown in FIGS. 2 and 3, the servo piston 22 moves the park actuator lever 24, which is coupled to the transmission parking mechanism 25. The transmission parking mechanism 25 is a mechanical linkage that mechanically prevents the starter motor from cranking the engine. The ETRS sensor 20 indicates the state of the transmission parking mechanism 25 as either engagement or disengagement of Park, i.e., either the in-park position or the out-of-park position. The electromagnetically sensed signal is transmitted to other control modules via a CAN bus. For ignition start operation, ETRS sensor 20 generates a primary signal which allows the driver to perform an engine startup when the transmission 14 is in the in-park position.

Figure 4:
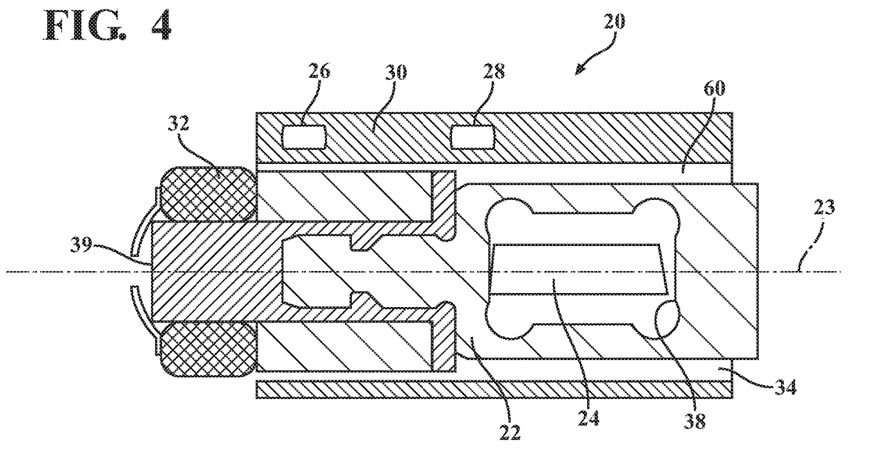
FIG. 4 is a schematic partial cross sectional view of the ETRS sensor.

FIG. 4 illustrates a partial cutaway section of the ETRS sensor 20. Referring to FIGS. 2-4, the housing 30 supports a first magnetic sensor 26 and a second magnetic sensor 28. The first magnetic sensor 26 is attached to the housing 30, and is positioned at a first axial position along the central axis 23. The second magnetic sensor 28 is attached to the housing 30, and is positioned at a second axial position along the central axis 23. The second axial position of the second magnetic sensor 28 is spaced from the first axial position of the first magnetic sensor 26 a separation distance along the central axis 23. The first magnetic sensor 26 and the second magnetic sensor 28 may be embedded within the housing 30. As set forth earlier, the first magnetic sensor 26 and second magnetic sensor 28 are Hall Effect sensors; however, the sensors may be other types of sensors that can perform the same sensing operation. The first magnetic sensor 26 and the second magnetic sensor 28 are spaced linearly apart from one another in the same plane; however, the sensors may be placed on different planes relative to one another. The first magnetic sensor 26 and the second magnetic sensor 28 are seated in a fixed position and encapsulated in a housing body 30. Preferably, housing 30 is made of a non-magnetic material including, but not limited to plastic, so as not to inhibit any magnetic fields generated by a magnet 32 which will be described in detail.

The sensor housing 30 further includes a bore 34, which extends along the central axis 23. The bore 34 receives the actuator piston 22 therethrough for displacing the park actuation lever 24. The actuator piston 22 includes an aperture 38 radially formed through a body of the actuator piston 22. The aperture 38 extends through the body of the piston 22 in a direction that is generally transverse to the central axis 23. The aperture 38 receives the park actuation lever 24, such that the actuation lever 24 is positioned within the aperture 38. As the actuator piston 22 is linearly displaced within the bore 34 of the housing 30, the actuator piston 22 exerts a force to displace the park actuation lever 24. The movement of the park actuator lever 24 results in movement of a park actuator lever rod 40 for shifting valves within the transmission 14 that are used to change the gears of the transmission 14.

The magnet 32 is mounted to a molded plastic magnet carrier 39 for generating a magnetic field. The magnet carrier 39 is slideably disposed within the bore 34. The molded plastic magnet carrier 39 is coupled to an end portion of the actuator piston 22, and is moveable with the actuator piston 22 within the bore 34. The molded plastic magnet carrier 39 is preferably made from a plastic, nylon, or other non-magnetic material.

The magnet 32 is attached to and movable with the magnet carrier 39. The magnet 32 may be an annular shaped magnet circumferentially disposed about an outer circumference of the molded plastic magnet carrier 39. It should be understood that other types of shapes and configurations of the magnet 32 may be utilized without deviating from the desired scope. The plastic magnet carrier 39 should have substantially a same OD as the servo piston 22 and magnet 32 in the region between the magnet 32 and the max outer diameter of the servo piston 22, so that a substantially uniform air gap 60 is maintained among these components within the bore 34 in the sensor housing 30. Accordingly, the air gap 60 is disposed between an interior surface of the bore 34 and an exterior surface of the magnet carrier 39 and the piston 22. The magnet 32 is preferably mounted near a distal end of the molded plastic magnet carrier 39, although it should be understood that locations other than the distal end may be utilized. For example, the magnet may be semicircular shaped, arcuate shaped, or planar shaped. However, the current design is rotationally symmetric, and if other configurations or shapes are utilized, keying features may be required to maintain positioning between the magnet 32 and the sensors 26, 28.

The magnet 32 while fixed to the molded plastic magnet carrier 39 is movable within the bore 34 of the ETRS sensor 20. That is, as the actuator piston 22 slideably moves within the bore 34, a respective wall forming the aperture 38 exerts a force on the park actuation lever 24 in a direction the piston 22 is moving for changing the transmission gear. As the actuator piston 22 moves within the bore 34, the magnet 32, which is attached to the molded plastic magnet carrier 39 which is in turn attached to the actuator piston 22, is linearly displaced within the bore 34. The magnet 32 generates a magnetic field. The magnetic field generated by the magnet 32 is sensed by the first magnetic sensor 26 and second magnetic sensor 28. Depending on the strength of the magnetic field, sensed by the first magnetic sensor 26 and the second magnetic sensor 28, the TCM 18 may determine whether the servo piston 22 is in the in-park position or the out-of-park position.

Figure 5:
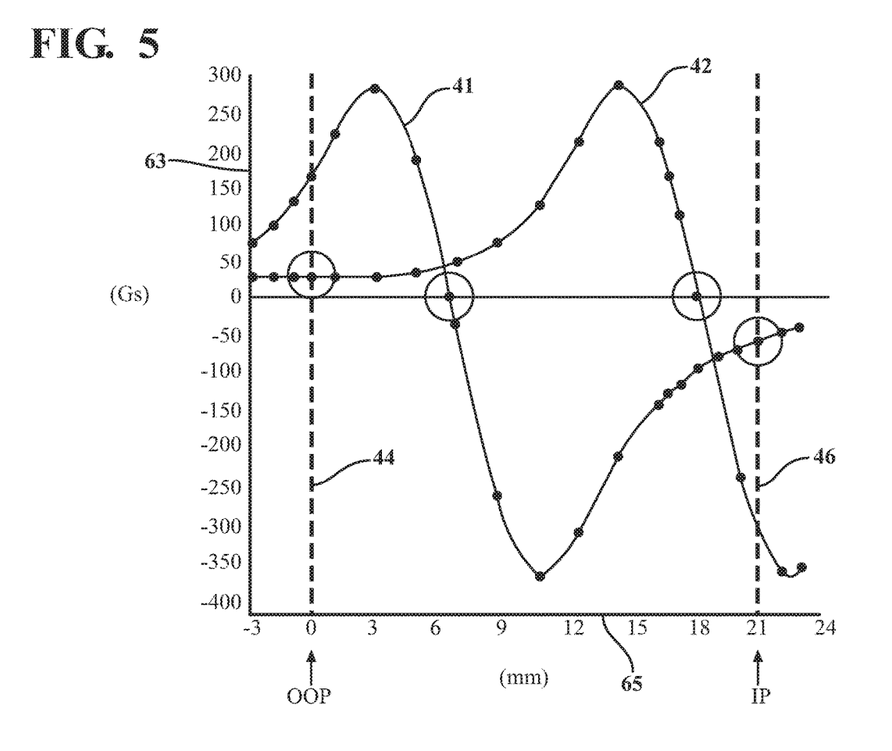
FIG. 5 is a graph showing a magnetic field strength sensed by a first ETRS sensor and a second ETRS sensor of the type shown in FIG. 4 on a vertical axis, and a distance from an out-of-park position on a horizontal axis.

A position of the magnet carrier along the central axis 23, and thereby a position of the piston 22 along the central axis 23, is determinable from a sensed magnetic flux from the first magnetic sensor 26 and a sensed magnetic flux from the second magnetic sensor 28. FIG. 5 illustrates a graph representing the magnetic field strengths sensed by the first magnetic sensor 26 and the second magnetic sensor 28. A vertical axis 63 of the graph represents the magnetic field strength at the sensor measured in Gauss. A horizontal axis 65 represents a distance from the out-of-park position in millimeters. Magnetic field strength generated at the first magnetic sensor 26 is represented by plot line 41 in the graph, whereas the magnetic field strength generated at the second magnetic sensor 28 is represented by plot line 42 in the graph. A reference line represented by 44 identifies the position that the piston 22 should be in for the out-of-park position, whereas a reference line represented by 46 identifies the position that the piston 22 should be in for the in-park position. A magnetic field strength threshold of 18 Gauss or greater indicates when the second magnetic sensor 28 senses that the transmission servo piston 22 is in the out-of-park position. A magnetic field strength threshold of −18 Gauss or less indicates when the first magnetic sensor 26 senses that the transmission servo piston 22 is in the in-park position. That is, the operation of both sensors 26 and 28 have a switching threshold of +18 Gauss or −18 Gauss depending on the magnetic field during the movement profile of the magnet 32. As an additional layer of redundancy, the two sensors 26 and 28 operate cooperatively in the sense that the out-of-park position is not determined unless both sensors 26 and 28 show signals above the +18 Gauss threshold as shown by the intersection of plot lines 41 and 42 with reference line 44, and the in-park position is determined when both sensors 26 and 28 show signals below the −18 Gauss threshold as shown by the intersection of plot lines 41 and 42 with reference line 46. This also provides an intermediate state to determine if the ETRS sensor 20 is transitioning between out-of-park 44 and in-park 46. As shown in FIG. 5, the magnetic field at sensor 28, near the out-of-park position, is very close to the switching threshold of 18 Gauss. As a result, false alarms may be triggered, particularly if the magnetic field strength is affected by noise which results in deviation in the magnetic field.

Figure 6:
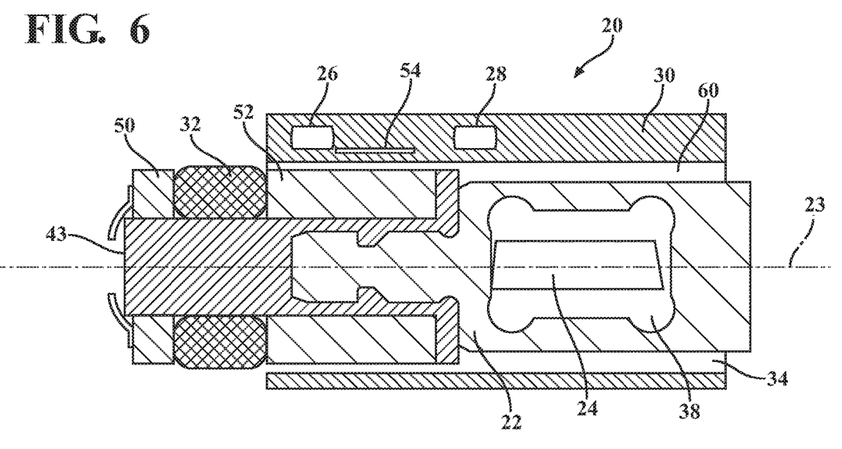
FIG. 6 is a schematic partial cross sectional view of the ETRS sensor with flux concentrators.

As illustrated in FIG. 6, in order to increase the robustness and reliability of the sensed magnetic field, at least one magnetic flux concentrator may be disposed in the sensor body housing 30 of the ETRS sensor 20, and/or as part of a molded plastic magnet carrier 43. The magnetic flux concentrators include ferrous material that is incorporated to respective sections of the molded plastic magnet carrier 43 and the sensor housing 30, relative to the first magnetic sensor 26 and second magnetic sensor 28. A first magnetic flux concentrator 50 is attached to the magnet carrier 43, and is coupled adjacent to the magnet 32, at a first axial side of the magnet 32 along the central axis 23. A second magnetic flux concentrator 52 is attached to the magnet carrier 43, and is coupled adjacent to the magnet 32, at a second axial side of the magnet 32, on the other side of the magnet 32 opposite of the first magnetic flux concentrator 50. Preferably, the first and second magnetic flux concentrators 50 and 52 are annularly shaped washer rings disposed around the outer circumference of the molded plastic magnet carrier 43. The first and second magnetic flux concentrators 50 and 52 are fixed to the molded plastic magnet carrier 43 and are displaced as the piston 22 is displaced. It should be understood that other shapes and configurations may be used such as arcuate-shaped, rectangular-shaped, square-shaped, circular-shaped, box-shaped, a planar member, or non-planar member; however depending upon the shape or configuration used, a keying feature may be required to maintain the desired location and positioning between the magnetic flux concentrators, sensors, and magnet. Moreover, it should be understood that the shape, configuration, and size of the first and second magnetic flux concentrators 50, 52 must be cooperatively designed so that the magnetic flux generated by the magnet 32 cooperatively concentrates and generates the magnetic field strength at a respective strength and in a respective direction. For example, the first magnetic flux concentrator 50 may include an outer diameter of 14.2 mm, an inner diameter of 7.0-12.4 mm for coupling to the molded plastic magnet carrier 43, and having a length of 0.1-3.0 mm, whereas the second magnetic flux concentrator 52 may include an outer diameter of 14.2 mm, an inner diameter of 7.0-12.4 mm for coupling to the molded plastic magnet carrier 43, and having a length of 9.6-12.8 mm. The exemplary dimensions of the respective magnetic flux concentrators are not fixed and are shown for illustrative purposes as to how the size and shape of the respective magnetic flux concentrators are cooperatively designed to enhance and concentrate the magnetic flux toward the sensors.

In addition, a third magnetic flux concentrator 54 is disposed in a fixed position within the housing 30. For example, the third magnetic flux concentrator 54 may be embedded within the housing 30. The third magnetic flux concentrator 54 as shown in FIG. 6 is shaped as a planar plate, and is disposed at a respective depth below the first and second magnetic sensors 26 and 28, in an axial position between the first magnetic sensor 26 and the second magnetic sensor 28 along the central axis 23. It should be understood that the third magnetic flux concentrator 54 can include other shapes and configurations and is not limited to a planar plate. The third magnetic flux concentrator 54 does not contact either sensor. However, the third magnetic flux concentrator 54 is positioned closer to the first magnetic sensor 26 than the second magnetic sensor 28. The third magnetic flux concentrator 54 is positioned at this location to concentrate the magnetic flux to the first and second magnetic sensors 26 and 28 for enhancing the reliability of detecting the out-of-park position and in-park position.

Figure 7:
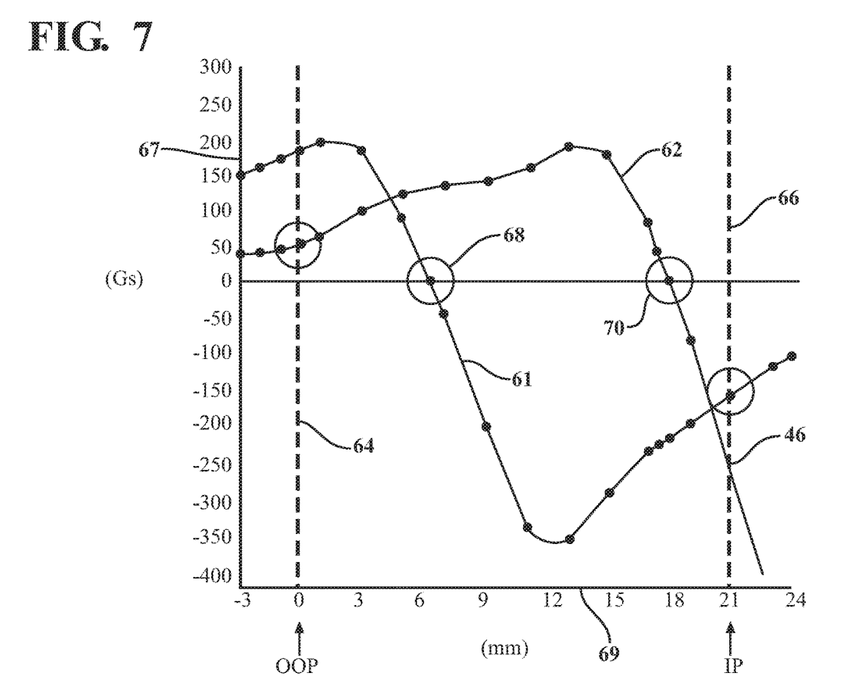
FIG. 7 is a graph showing a magnetic field strength sensed by a first ETRS sensor and a second ETRS sensor of the type shown in FIG. 6 on a vertical axis, and a distance from an out-of-park position on a horizontal axis.

FIG. 7 illustrates a graph representing the magnetic field strengths sensed by the first magnetic sensor 26 and the second magnetic sensor 28 when the magnetic flux concentrators 50, 52, 54 are utilized. A vertical axis 67 of the graph represents the magnetic field strength at the sensor measured in Gauss. A horizontal axis 69 represents a distance from an out-of-park position in millimeters. Field strength generated at the first magnetic sensor 26 is represented by plot line 61 in the graph whereas the field strength generated at the second magnetic sensor 28 is represented by plot line 62 in the graph. A reference line represented by 64 identifies the position when the park servo piston 22 should be in the out-of-park position, whereas a reference line represented by 66 identifies when the park servo piston 22 should be in the park position. As shown in FIG. 7, the magnetic field sensed at the out-of-park position by the second magnetic sensor 28 is approximately two times the magnetic field strength of the design illustrated in the graph in FIG. 5. In addition, the magnetic field sensed by the first magnetic sensor 26 at the in-park position is approximately two times the field strength of the design illustrated in the graph of FIG. 5. As a result, magnetic field strength measurements as sensed by both sensors 26, 28 for the out-of-park and in-park positions utilizing the magnetic flux concentrators 50, 52, 54 are increased significantly beyond the switching threshold of ±18 Gauss. This provides enhanced reliability and robustness in determining in-park and out-of-park positions.

It is also shown in the graph in FIG. 7 that the profile of the magnetic field strength measurements between the out-of-park position and in-park position is substantially maintained relative to the design as shown in FIG. 5. This is evidenced by points where polarity of the magnetic field switches between positive and negative in both FIGS. 5 and 7. This is pertinent as the system constantly monitors the magnetic field while the magnet 32 transitions between the out-of-park and in-park position. In hybrid vehicles, where the ignition is cycled on and off while the vehicle is temporarily stopped but the transmission remains in the out-of-park range, voltage and current surges may be caused from the startup for these hybrid operations, which may cause noise in the form of magnetic fields which may result in false readings. Therefore, to enhance the reliability as to whether the measured magnetic field is the result of the magnetic field generated by the magnet or some other magnetic field within the vehicle, a profile of each respective sensor is monitored to verify whether the magnetic field strength profile is substantially similar to prior test results. To verify the profile, polarity switching of the magnetic field is monitored between the reference line 64 (representing the out-of-park position) and reference line 66 (representing the in-park position). Polarity switching is identified generally by point 68 for the first magnetic sensor measurement and generally by point 70 for the second magnetic sensor measurement. Points 68 and 70 are locations where the magnetic flux measurement values intersect the zero magnetic field strength value. This represents the value when polarity of the magnetic field strength switches from positive to negative or vice versa. As a result, changes in polarity are expected at substantially points 68 and 70. Changes in polarity that are substantially different from these points are indications that the magnetic fields sensed by the first and second magnetic sensors are not entirely generated by the magnet. A comparison between FIG. 5 and FIG. 7 illustrates that while the magnetic field strength is enhanced at the out-of-park and in-park reference lines, polarity switching points between each graph remains substantially the same, which assists in maintaining reliability in identifying whether the magnet flux is generated by the magnet or noise.

The introduction of the magnetic flux concentrators 50, 52, 54 to focus the magnetic flux from the magnet 32 towards the sensors 26, 28 not only allow for operation of the system within the desired specifications, but further improves the magnet stability to prevent the possibility of demagnetization during temperature cycling and/or exposure to external magnetic fields.

In FIGS. 8-15, for each of the drawings, the following components will be identified in the drawings for illustrating the respective components relative to the magnet field. These components include the first magnetic sensor 26, the second magnetic sensor 28, the magnet 32, and the magnetic flux concentrators 50, 52, and 54. FIGS. 8, 9, 12, and 13 represent the magnetic field intensity with shaded regions. Specifically, the darker shaded regions represent lower magnetic field intensity, whereas the lighter shaded regions represent high magnetic field intensity.

Figure 8:
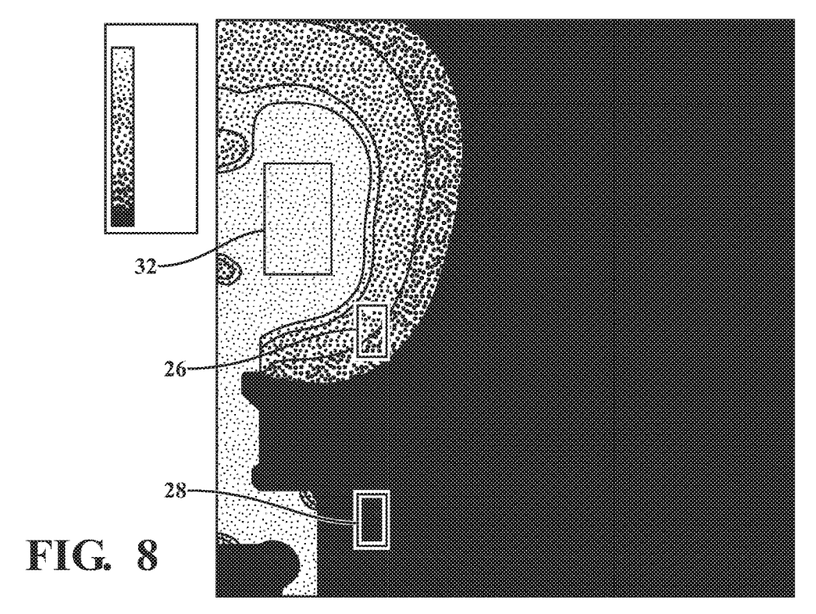
FIG. 8 is a schematic diagram of magnetic field intensity at the out-of-park position.
Figure 9:
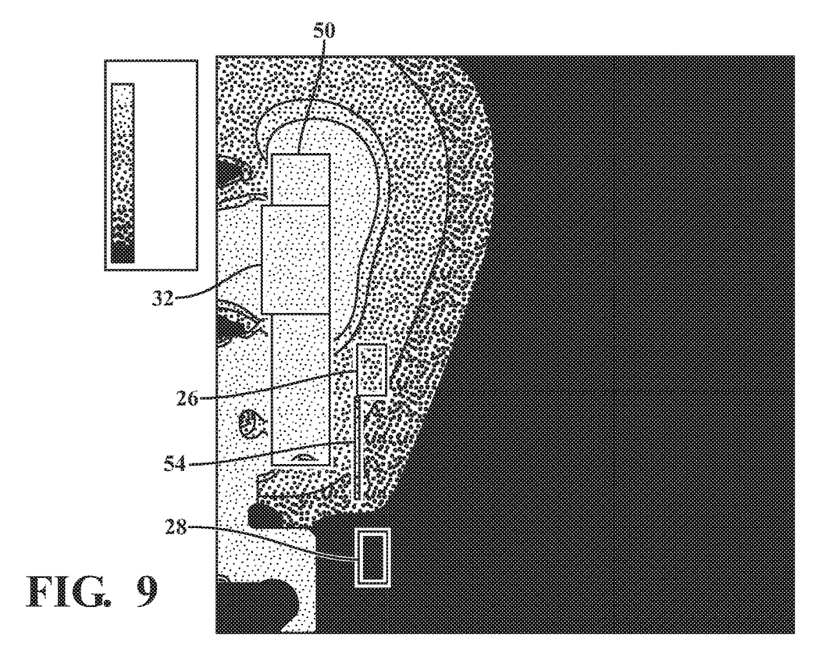
FIG. 9 is a schematic diagram of magnetic field intensity at the out-of-park position with the magnetic flux concentrators.

FIG. 8 illustrates a magnetic field intensity diagram illustrating the ETRS sensor 20 total magnetic field magnitude without the magnetic flux concentrators 50, 52, 54 when the transmission servo piston 22 is in the out-of-park position. As shown in FIG. 8, the first magnetic sensor 26 and the second magnetic sensor 28 measure the magnetic field generated by the magnet 32. In contrast, FIG. 9 illustrates a magnetic field intensity diagram illustrating the ETRS sensor 20 total magnetic field magnitude generated by the magnet 32 with the magnetic flux concentrators 50, 52, 54 when the transmission servo piston 22 is in the out-of-park position. As shown from the respective diagrams, the magnetic field intensity is enhanced at the first magnetic sensor 26 when comparing the respective diagrams. As a result, magnetic field sensor readings will be greater when using the magnetic flux concentrators 50, 52, 54 and will allow enhanced detection in the out-of-park position.

Figure 10:
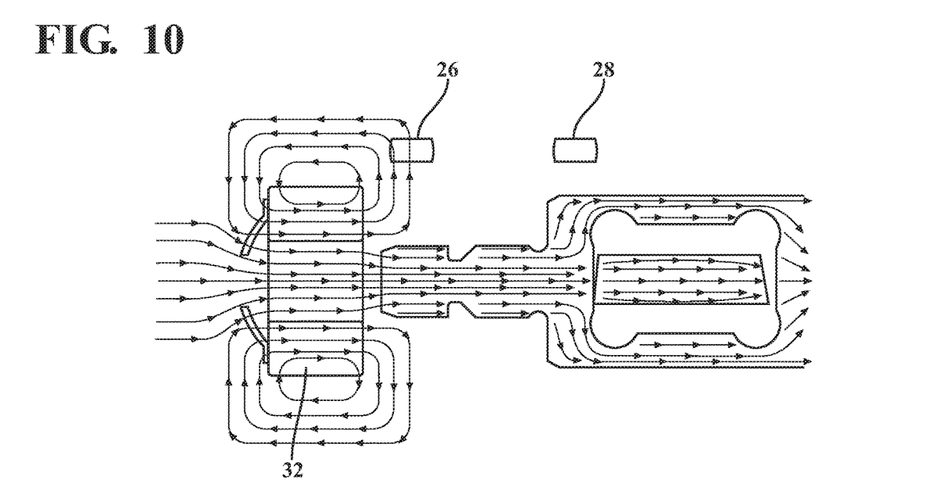
FIG. 10 is a schematic vector flow diagram of the magnetic field as shown in FIG. 8.
Figure 11:
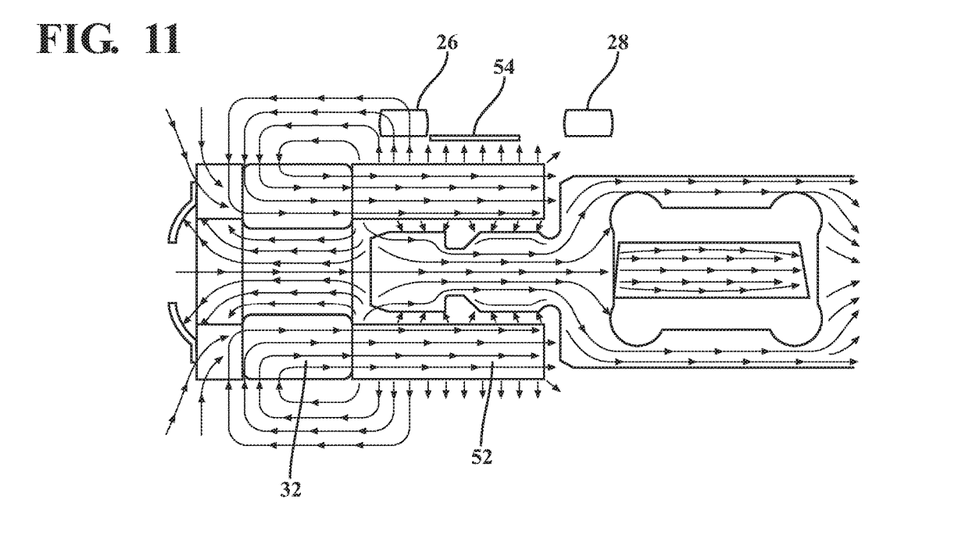
FIG. 11 is a schematic vector flow diagram of the magnetic field as shown in FIG. 9.

FIG. 10 and FIG. 11 illustrate vector flow diagrams for the magnetic fields generated for the ETRS sensor 20 without the magnetic field concentrators 50, 52, 54 and with the magnetic field concentrators 50, 52, 54, respectively, when the transmission servo piston 22 is in the out-of-park position. As shown in FIG. 11, the vector field is enhanced in concentrating the magnetic field toward the first magnetic sensor 26 when utilizing the magnetic flux concentrators 50, 52, 54 as opposed to not utilizing the magnetic flux concentrators 50, 52, 54 in FIG. 10. It is also noted that FIG. 11 illustrates the enhanced magnetic field as a result of using the magnetic flux concentrators 50, 52, 54 in comparison to FIG. 10 where the magnetic flux concentrators 50, 52, 54 are not present.

Figure 12:
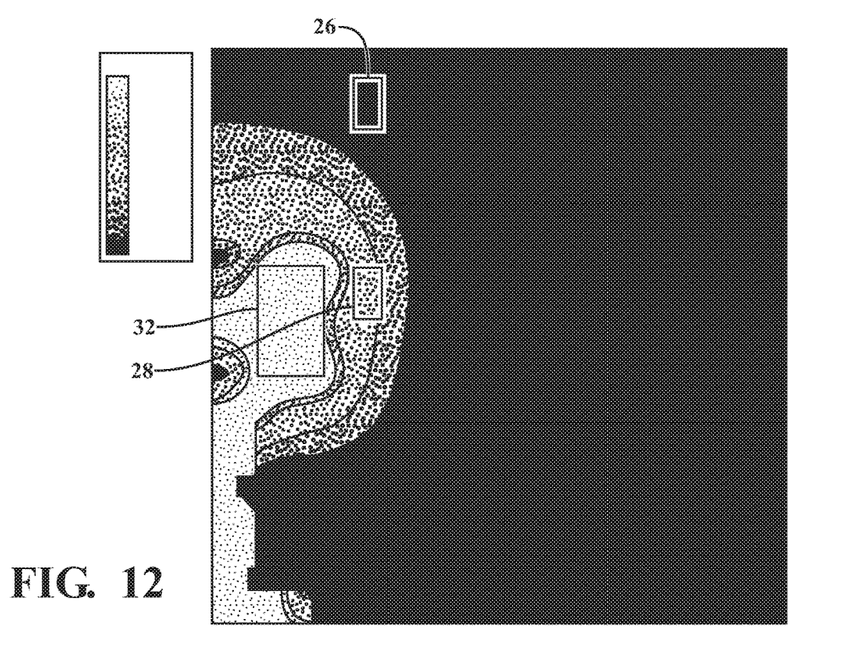
FIG. 12 is a schematic magnetic field intensity diagram at the in-park position.
Figure 13:
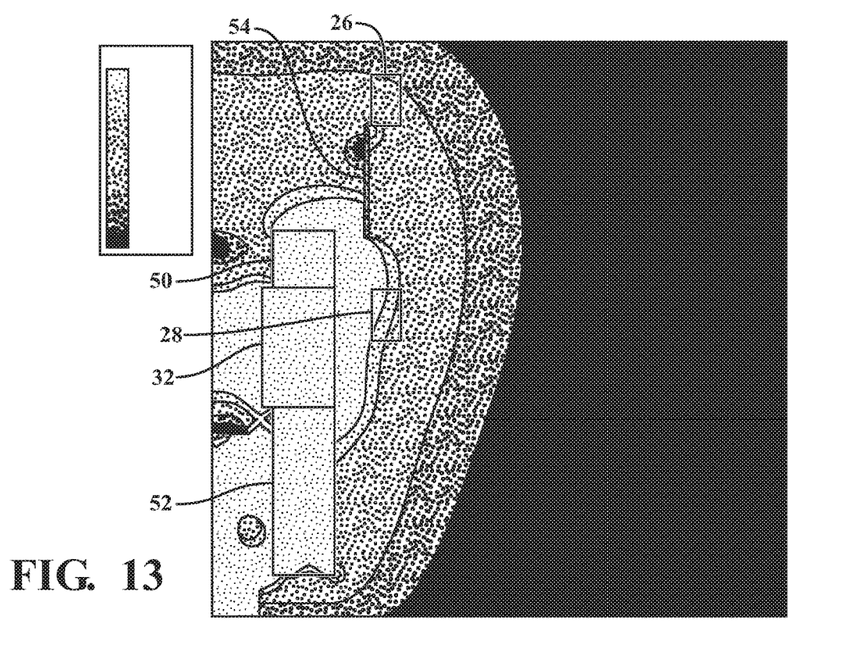
FIG. 13 is a schematic magnetic field intensity diagram at the in-park position with the magnetic flux concentrators.

FIG. 12 illustrates a magnetic field intensity diagram illustrating the ETRS sensor 20 total magnetic field magnitude without the magnetic flux concentrators 50, 52, 54 when the transmission servo piston 22 is in the in-park position. In contrast, FIG. 13 illustrates a magnetic field intensity diagram illustrating the ETRS sensor 20 total magnetic field magnitude generated by the magnet 32 with the magnetic flux concentrators 50, 52, 54 when the transmission servo piston 22 is in the in-park position. As shown from the respective diagrams, the magnetic field intensity is enhanced at the first magnetic sensor 26 and second magnetic sensor 28 when comparing the respective diagrams. As a result, magnetic field sensor readings will be greater when using the magnetic flux concentrators 50, 52, 54 and will allow enhanced detection in the in-park position.

Figure 14:
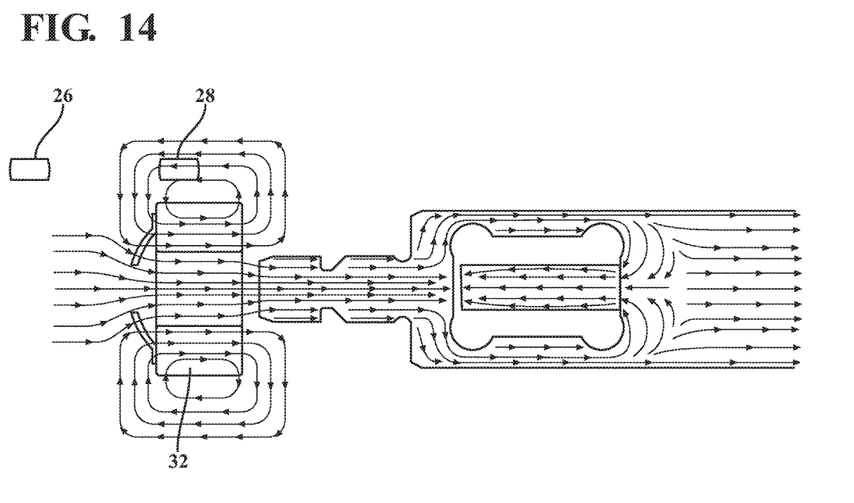
FIG. 14 is a schematic vector flow diagram of the magnetic field as shown in FIG. 12.
Figure 15:
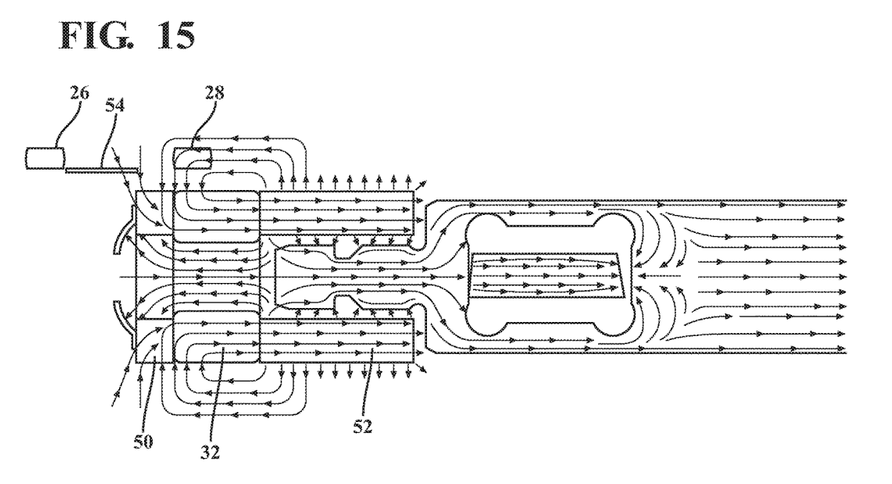
FIG. 15 is a schematic vector flow diagram of the magnetic field as shown in FIG. 13.

FIG. 14 and FIG. 15 illustrate vector flow diagrams for the magnetic fields generated for the ETRS sensor 20 without the magnetic field concentrators 50, 52, 54 and with the magnetic field concentrators 50, 52, 54, respectively, when the transmission servo piston 22 is in the in-park position. As shown in FIG. 15, the vector field is enhanced in concentrating the magnetic field toward the first and second magnetic sensors 26 and 28 when utilizing the magnetic flux concentrators 50, 52, 54 as opposed to not utilizing the magnetic flux concentrators 50, 52, 54 in FIG. 14.

The detailed description and the drawings or figures are supportive and descriptive of the disclosure, but the scope of the disclosure is defined solely by the claims. While some of the best modes and other embodiments for carrying out the claimed teachings have been described in detail, various alternative designs and embodiments exist for practicing the disclosure defined in the appended claims.

What is claimed is:

1. A transmission range selection sensor comprising:
a housing defining a bore extending along a central axis;
a magnet carrier slideably disposed within the bore;
a magnet attached to and moveable with the magnet carrier, with the magnet generating a magnetic field defining a magnetic flux;
a first magnetic sensor attached to the housing and positioned at a first axial position along the central axis;
a second magnetic sensor attached to the housing and positioned at a second axial position along the central axis, with the second axial position spaced from the first axial position along the central axis;
wherein a position of the magnet carrier along the central axis is determinable from a sensed magnetic flux from the first magnet sensor and a sensed magnetic flux from the second magnet sensor; and
at least one magnetic flux concentrator attached to one of the magnet carrier or the housing and operable to concentrate the magnetic flux toward at least one of the first magnetic sensor or the second magnetic sensor depending upon a position of the magnet along the central axis.

2. The transmission range selection sensor set forth in claim 1, further comprising a piston attached to and moveable with the magnet carrier within the bore.

3. The transmission range selection sensor set forth in claim 2, further comprising an actuation lever engaged with the piston, whereby axial movement of the piston along the central axis moves the actuation lever for controlling a transmission gear range.

4. The transmission range selection sensor set forth in claim 3, wherein the piston includes an aperture extending through the piston in a direction transverse to the central axis, with the actuation lever positioned within the aperture.

5. The transmission range selection sensor set forth in claim 1, further comprising an air gap between an interior surface of the bore and an exterior surface of the magnet carrier.

6. The transmission range selection sensor set forth in claim 2, further comprising a servo connected to the piston and operable to move the piston along the central axis.

7. The transmission range selection sensor set forth in claim 1, wherein the at least one magnetic flux concentrator is a ferrous material.

8. The transmission range selection sensor set forth in claim 1, wherein the at least one magnetic flux concentrator includes a first magnetic flux concentrator attached to the magnet carrier and disposed adjacent to the magnet at a first axial side of the magnet along the central axis.

9. The transmission range selection sensor set forth in claim 8, wherein the at least one magnetic flux concentrator includes a second magnetic flux concentrator attached to the magnet carrier and disposed adjacent to the magnet at a second axial side of the magnet along the central axis.

10. The transmission range selection sensor set forth in claim 9, wherein the at least one magnetic flux concentrator includes a third magnetic flux concentrator attached to the housing and positioned between the first magnetic sensor and the second magnetic sensor along the central axis.

11. The transmission range selection sensor set forth in claim 10, wherein the third magnetic flux concentrator is positioned nearer to the first magnetic sensor than the second magnetic sensor along the central axis.

12. The transmission range selection sensor set forth in claim 10, wherein the third magnetic flux concentrator is embedded within the housing.

13. The transmission range selection sensor set forth in claim 1, wherein the housing is a non-magnetic material, and wherein the first magnetic sensor and the second magnetic sensor are embedded within the housing.

14. A transmission range selection sensor comprising:
a housing defining a bore extending along a central axis;
a piston slideably disposed within the bore and moveable along the central axis between an in-park-position and an out-of-park position;
an actuation lever engaged with the piston, whereby axial movement of the piston along the central axis moves the actuation lever for controlling a transmission gear range;

a magnet carrier attached to and moveable with the piston;

a magnet attached to and moveable with the magnet carrier, with the magnet generating a magnetic field;

a first magnetic sensor attached to the housing and positioned at a first axial position along the central axis;

a second magnetic sensor attached to the housing and positioned at a second axial position along the central axis, with the second axial position spaced from the first axial position along the central axis;

at least one magnetic flux concentrator attached to one of the magnet carrier or the housing, and operable to enhance the flow of flux in a direction of either the first magnetic sensor or the second magnetic sensor as a function of a position of the magnet.

15. The transmission range selection sensor set forth in claim 14, wherein the at least one magnetic flux concentrator is a ferrous material.

16. The transmission range selection sensor set forth in claim 14, wherein the at least one magnetic flux concentrator includes a first magnetic flux concentrator attached to the magnet carrier and disposed adjacent to the magnet at a first axial side of the magnet along the central axis.

17. The transmission range selection sensor set forth in claim 16, wherein the at least one magnetic flux concentrator includes a second magnetic flux concentrator attached to the magnet carrier and disposed adjacent to the magnet at a second axial side of the magnet along the central axis.

18. The transmission range selection sensor set forth in claim 16, wherein the at least one magnetic flux concentrator includes a third magnetic flux concentrator attached to the housing and positioned between the first magnetic sensor and the second magnetic sensor along the central axis.

19. The transmission range selection sensor set forth in claim 18, wherein the third magnetic flux concentrator is positioned nearer to the first magnetic sensor than the second magnetic sensor along the central axis.

* * * * *